United States Patent
Kim et al.

(10) Patent No.: US 12,541,150 B2
(45) Date of Patent: Feb. 3, 2026

(54) SUBSTRATE PROCESSING APPARATUS AND METHOD THEREOF

(71) Applicant: SEMES CO., LTD., Chungcheongnam-do (KR)

(72) Inventors: Ick Kyun Kim, Gyeonggi-do (KR); Sung Hun Eom, Gyeonggi-do (KR)

(73) Assignee: SEMES CO., LTD., Chungcheongnam-do (KR)

(*) Notice: Subject to any disclaimer, the term of this patent is extended or adjusted under 35 U.S.C. 154(b) by 412 days.

(21) Appl. No.: 17/990,659

(22) Filed: Nov. 19, 2022

(65) Prior Publication Data
US 2023/0367233 A1    Nov. 16, 2023

(30) Foreign Application Priority Data
Dec. 2, 2021    (KR) .......................... 10-2021-0171128

(51) Int. Cl.
*H01L 21/02* (2006.01)
*G03F 7/16* (2006.01)

(52) U.S. Cl.
CPC ........ *G03F 7/162* (2013.01); *H01L 21/02087* (2013.01)

(58) Field of Classification Search
CPC .......................... G03F 7/162; H01L 21/02087
USPC ........................................................ 134/147
See application file for complete search history.

(56) References Cited

U.S. PATENT DOCUMENTS

| 6,983,755 B2 | 1/2006 | Nam et al. |
| 2003/0098040 A1 | 5/2003 | Nam et al. |
| 2006/0076034 A1 | 4/2006 | Nam et al. |
| 2013/0139858 A1 | 6/2013 | Shimai |

FOREIGN PATENT DOCUMENTS

| JP | 3-77319 | 4/1991 |
| JP | 10-106998 | 4/1998 |
| JP | 2001-46985 | 2/2001 |
| JP | 2010-147262 | 7/2010 |
| JP | 2013-118209 | 6/2013 |
| KR | 10-2003-0043235 | 6/2003 |

(Continued)

OTHER PUBLICATIONS

KR20100071895A—machine translation (Year: 2010).*

(Continued)

*Primary Examiner* — Tinsae B Ayalew
(74) *Attorney, Agent, or Firm* — WOMBLE BOND DICKINSON (US) LLP (57) ABSTRACT

Provided is a substrate processing apparatus capable of effectively removing contaminants in an edge region of a substrate. The substrate processing apparatus comprises: a support configured to rotate a substrate; a first bath installed around the support and configured to store a cleaning liquid and form a first opening on an upper surface thereof; and a first ultrasonic oscillator installed in the first bath and configured to provide an ultrasonic wave towards a surface of the cleaning liquid exposed by the first opening and form a first water film protruding from the surface of the cleaning liquid, wherein the substrate is not immersed in the first bath, and the edge region of the substrate is cleaned by the protruding first water film while rotating the substrate by the support.

17 Claims, 11 Drawing Sheets

(56) References Cited

FOREIGN PATENT DOCUMENTS

| KR | 10-2010-0071895 | | 6/2010 | |
|---|---|---|---|---|
| KR | 20100071895 A | * | 6/2010 | |
| KR | 10-1612633 | | 4/2016 | |
| WO | WO-2007060844 A1 | * | 5/2007 | ........... G02F 1/1303 |

OTHER PUBLICATIONS

WO2007060844A1—machine translation (Year: 2007).*
Office Action dated Aug. 29, 2023 for Korean Patent Application No. 10-2021-0171128 and its English translation from Global Dossier.
Office Action dated Jan. 16, 2024 for Japanese Patent Application No. 2022-189871 and its English translation from Global Dossier.
Office Action (1st) dated Sep. 26, 2025 for Chinese Patent Application No. 202211480719.0 and its English translation provided by Applicant's foreign counsel/Global Dossier.

* cited by examiner

SUBSTRATE PROCESSING APPARATUS AND METHOD THEREOF

CROSS-REFERENCE TO RELATED APPLICATION

This application claims priority from Korean Patent Application No. 10-2021-0171128 filed on Dec. 2, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate processing apparatus and a method thereof.

2. Description of the Related Art

When manufacturing a semiconductor device or a display device, a variety of processes such as photography, etching, ashing, ion implantation, thin film deposition, and cleaning are performed. Herein, a photographic process includes the coating process, the exposure process, and the developing process. A photoresist liquid is applied on a substrate (i.e., the coating process), a circuit pattern is exposed on the substrate on which the photoresist film is formed (i.e., the exposure process), and the exposed area of the substrate is selectively developed (i.e., the developing process).

SUMMARY

Meanwhile, contaminants may be attached to an edge region (particularly, an apex) of the substrate. Such contaminants can be transmitted onto the substrate in the process of coating and baking a photoresist liquid on the substrate. The contaminants transmitted onto the substrate cause defects in the exposure process.

Aspects of the present disclosure provide a substrate processing apparatus capable of effectively removing contaminants in an edge region of a substrate.

Aspects of the present disclosure also provide a substrate processing method capable of effectively removing contaminants in an edge region of a substrate.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Liquid

According to an aspect of the present disclosure, there is provided a substrate processing apparatus comprising: a support configured to rotate a substrate; a first bath installed around the support and configured to store a cleaning liquid and form a first opening on an upper surface thereof; and a first ultrasonic oscillator installed in the first bath and configured to provide an ultrasonic wave towards a surface of the cleaning liquid exposed by the first opening and form a first water film protruding from the surface of the cleaning liquid. The substrate is not immersed in the first bath, and the edge region of the substrate is cleaned by the protruding first water film while rotating the substrate by the support.

According to another aspect of the present disclosure, there is provided a substrate processing apparatus comprising: a support configured to rotate a substrate; a first bath installed around the support and configured to store a first cleaning liquid and form a first opening on an upper surface thereof; a first ultrasonic oscillator installed on a bottom surface of the first bath and configured to provide an ultrasonic wave towards a surface of the cleaning liquid exposed by the first opening and form a first water film protruding from the surface of the first cleaning liquid; a first nozzle disposed on an upper part of the first bath to be inclined towards an edge region of the substrate and configured to spray a cleaning gas onto an upper surface of the edge region of the substrate; a second bath spaced apart from the first bath around the support and configured to store a second cleaning liquid and form a second opening on an upper surface thereof; a second ultrasonic oscillator installed on a bottom surface of the second bath and configured to provide the ultrasonic wave towards a surface of the second cleaning liquid exposed by the second opening and form a second water film protruding from the surface of the second cleaning liquid; and a second nozzle disposed on an upper part of the second bath to be inclined towards an edge region of the substrate and configured to spray the cleaning gas onto the upper surface of the edge region of the substrate. The substrate is not immersed in the first bath and the second bath, and the edge region of the substrate is cleaned by the protruding first and second water films while rotating the substrate by the support.

According to an aspect of the present disclosure, there is also provided a substrate processing method comprising: providing a substrate processing device including a chamber, a support disposed in the chamber, a first bath installed around the support and configured to store a cleaning liquid, and a first ultrasonic oscillator installed in the first bath; disposing the substrate on the support in the chamber; coating a photoresist liquid on the substrate while rotating the substrate by the support; and while rotating the substrate by the support, providing, by the first ultrasonic oscillator, an ultrasonic wave towards a surface of the cleaning liquid stored in the first bath and forming a first water film protruding from the surface of the cleaning liquid, and cleaning an edge region of the substrate by the protruding first water film.

Specific details of other embodiments are included in the detailed description and the drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

The spatially relative terms "below", "beneath", "lower", "above", "upper" may be used to easily describe the correlation of a device or components with other devices or components. Spatially relative terms are to be understood as including terms in different directions of the device in use or operation in addition to the directions shown in the figures. For example, when flipping a device shown in the figure, a device described as "below" or "beneath" of another device may be placed "above" of another device. Thus, the exemplary term "below" can encompass both an orientation of above and below. The device can also be oriented in other directions, so that spatially relative terms can be interpreted according to orientation.

Although the first, second, etc. are used to describe various elements, components and/or sections, these elements, components and/or sections are of course not limited by these terms. These terms are only used to distinguish one element, component or section from another element, component or section. Therefore, the first device, the first component, or the first section mentioned below may be a second device, a second component, or a second section within the technical spirit of the present disclosure.

Hereinafter, preferred embodiments according to the present disclosure are described in detail with reference to the accompanying drawings. The same or similar elements are assigned the same reference numerals irrespective of their reference numerals, and a redundant description thereof is omitted.

Figure 1:
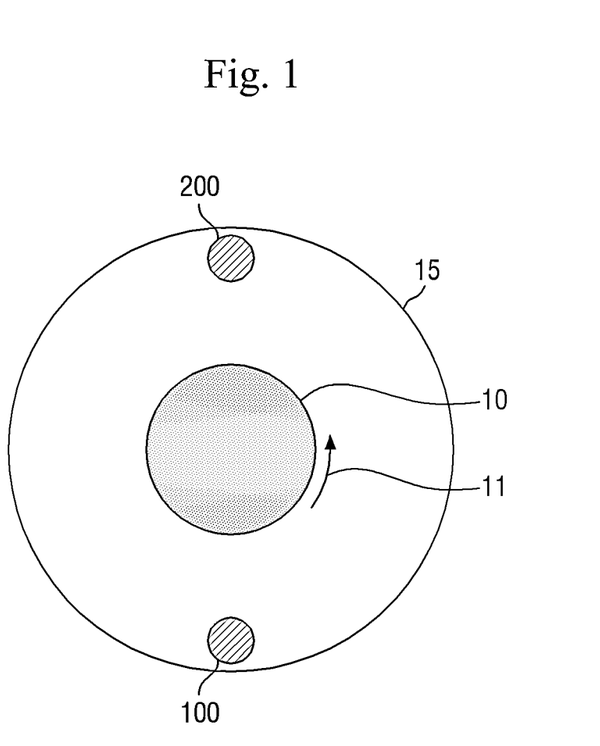
FIG. 1 is a conceptual view describing a substrate processing apparatus according to a first embodiment of the present disclosure.
Figure 2:
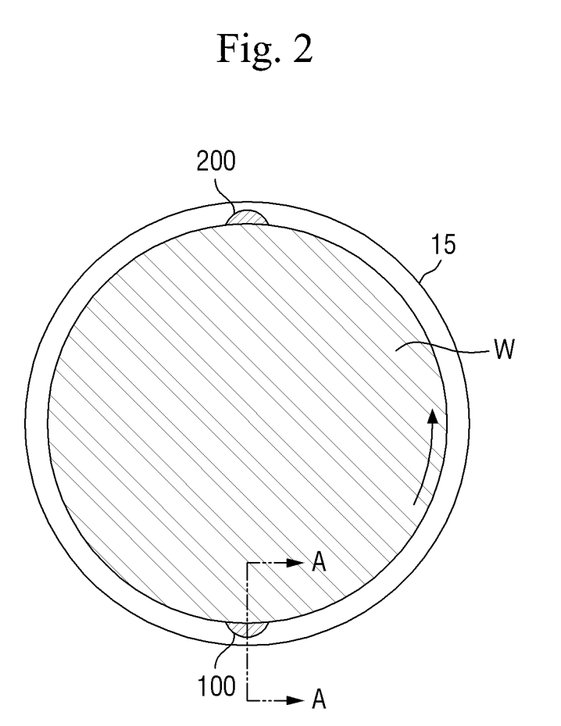
FIG. 2 is a conceptual view illustrating a substrate disposed on the substrate processing apparatus of FIG. 1.
Figure 3:
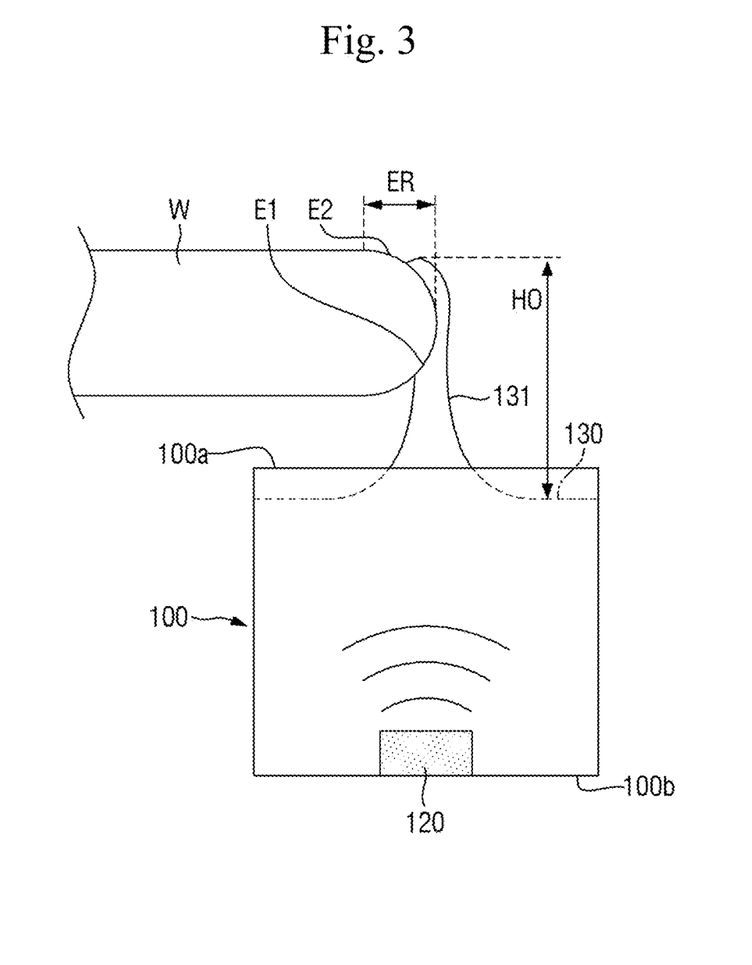
FIG. 3 is a sectional view taken along line A-A of FIG. 2.

FIG. 1 is a conceptual view describing a substrate processing apparatus according to a first embodiment of the present disclosure. FIG. 2 is a conceptual view illustrating a substrate disposed on the substrate processing apparatus of FIG. 1. FIG. 3 is a sectional view taken along line A-A of FIG. 2.

First, referring to FIGS. 1 and 2, the substrate processing apparatus according to the first embodiment of the present disclosure includes a base 15, a first bath 100, a second bath 200, and a support 10.

The support 10 is disposed in a central area of the base 15. The support 10 supports a substrate W and may rotate the substrate W (see reference numeral 11).

The first bath 100 is installed around the support 10 and stores a cleaning liquid.

The second bath 200 is installed around the support 10 and stores the cleaning liquid. As illustrated, the second bath 200 may be disposed in a symmetrical position around the support 10 (i.e., around a rotational axis of the support), but the present disclosure is not limited thereto.

Herein, referring to FIG. 3, a first opening 100a is formed on an upper surface of the first bath 100.

A first ultrasonic oscillator 120 is installed in the first bath 100 and provides an ultrasonic wave towards a surface 130 of the cleaning liquid exposed by the first opening 100a, thus forming a first water film 131 protruding from the surface 130 of the cleaning liquid.

The drawing illustrates that the first ultrasonic oscillator 120 is installed on a bottom surface 100b of the first bath 100 so that it is immersed in the cleaning liquid, but the present disclosure is not limited thereto. For example, when the bottom surface 100b is a material through which the ultrasonic wave can pass, the first ultrasonic oscillator 120 may be installed under the bottom surface 100b so that it is not immersed in the cleaning liquid.

A height H0 of the protruding first water film 131 may be adjusted by adjusting an oscillation output of the first ultrasonic oscillator 120. Furthermore, the height H0 of the protruding first water film 131 may be changed according to the viscosity and temperature of the cleaning liquid. Therefore, it is necessary to control the oscillation output, viscosity, and temperature so that the height H0 of the protruding first water film 131 matches a target height. In the substrate processing apparatus according to the first embodiment of the present disclosure, the height H0 of the protruding first water film 131 may be, for example, about 5 mm to about 15 mm from the surface 130 of the cleaning liquid, but the present disclosure is not limited thereto.

A target material to be cleaned may be changed by adjusting an oscillation frequency of the first ultrasonic oscillator 120.

For example, the oscillation frequency may be divided into ultrasonic and megasonic.

The ultrasonic may be within the range of several tens of kHz to several hundreds of kHz, for instance, in the range of 20 kHz to 400 kHz. The ultrasonic enables cleaning using cavitation. When the ultrasonic is applied into the cleaning liquid, bubbles burst in the cleaning liquid, which can destroy or isolate foreign substances of the object to be cleaned.

The megasonic may be in the range of several tens of MHz, for instance, in the range of 700 kHz to 1.2 MHz. By using the megasonic, foreign substances of sub-micron size can be removed. Unlike the ultrasonic, the megasonic does not result in cavitation and increases particle acceleration to peel the foreign substances from the object to be cleaned.

The ultrasonic can remove relatively large foreign substances (e.g., several tens of micrometers), and the megasonic can remove relatively small foreign substances (e.g., 1 μm or less).

The first ultrasonic oscillator 120 generates an ultrasonic wave with the oscillation frequency in an appropriate range in consideration of the size of the target material.

The substrate W is not immersed in the first bath 100 and is disposed that an edge region ER of the substrate W is adjacent to the first opening 100a. The edge region ER of the substrate W may be cleaned by the first water film 131 protruding by the first ultrasonic oscillator 120.

Specifically, the edge region ER of the substrate W includes a bottom bevel E1 and an upper bevel E2. The bottom bevel E1 is an area that extends from a lower surface of the substrate W to an apex of the substrate W, and the upper bevel E2 is an area that extends from an upper surface of the substrate W to the apex of the substrate W.

Since the first water film 131 protrudes upwards from the bottom of the substrate W, the bottom bevel E1 can be cleaned. Furthermore, due to the stress of the first water film 131, the first water film 131 can be in contact with the upper bevel E2 to clean the upper bevel E2.

Although this is not illustrated separately, a second ultrasonic oscillator is also installed in the second bath 200 (see FIG. 1). The structure and control method of the second bath 200 and the second ultrasonic oscillator are substantially identical to those of the first bath 100 and the first ultrasonic oscillator 120 described with reference to FIG. 3. In other words, the second ultrasonic oscillator provides the ultrasonic wave towards the surface of the cleaning liquid exposed by a second opening of the second bath 200, thus forming a second water film protruding from the surface of the cleaning liquid.

The cleaning liquid stored in the first bath 100 and the cleaning liquid stored in the second bath 200 may be different materials. For example, the cleaning liquid of the first bath 100 may be DIW, while the cleaning liquid of the second bath 200 may be IPA. Accordingly, the first water film 131 generated in the first bath 100 and the second water film generated in the second bath 200 can performing the cleaning by targeting different materials.

Alternatively, the oscillation output of the first ultrasonic oscillator 120 for forming the first water film 131 may be different from the oscillation output of the second ultrasonic oscillator for forming the second water film. Accordingly, the height of the first water film 131 and the height of the second water film may be controlled differently. In this way, the first water film 131 generated in the first bath 100 and the second water film generated in the second bath 200 can perform the cleaning by targeting and cleaning contaminants placed at different heights.

Meanwhile, FIGS. 1 and 2 illustrate that the first bath 100, the second bath 200 and the support 10 all are formed on one base 15, but the present disclosure is not limited thereto. For instance, each of the first bath 100, the second bath 200 and the support 10 may be disposed on different bases.

In addition, the two baths 100 and 200 are described to have been used, but the present disclosure is not limited thereto. Three or more baths may be used, or only one bath may be used.

In addition, in FIG. 1, the first bath 100 and the second bath 200 are illustrated to have a dot type (i.e., disposed in predetermined points on the base 15), but the present disclosure is not limited thereto. For instance, the first bath 100 or the second bath 200 may be elongated along an arc of the base 15.

Figure 4:
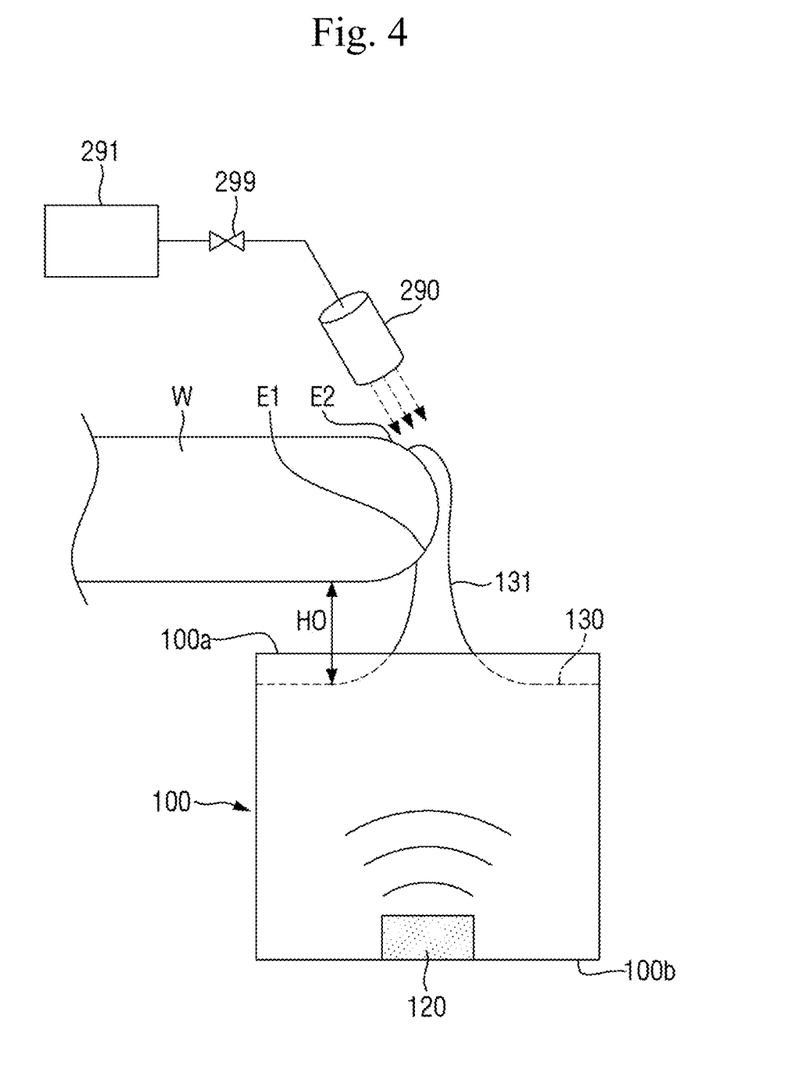
FIG. 4 is a conceptual view describing the substrate processing apparatus according to a second embodiment of the present disclosure.

FIG. 4 is a conceptual view describing the substrate processing apparatus according to a second embodiment of the present disclosure. For convenience of description, the differences from the content described with reference to FIGS. 1 to 3 will be mainly described.

Referring to FIG. 4, the substrate processing apparatus according to the second embodiment of the present disclosure further includes a first nozzle 290 configured to spray a cleaning gas to an upper surface of the edge region ER of the substrate W. The cleaning gas may be, for example, an inert gas (e.g., $N_2$ and He). The first nozzle 290 is connected to a cleaning gas storage 291. According to turning on/off of a valve 299, the cleaning gas is supplied to the upper surface of the edge region of the substrate W via the first nozzle 290. As illustrated, since the first nozzle 290 is inclined towards the edge region of the substrate W, the cleaning gas sprayed from the first nozzle 290 can push the contaminants out of the substrate W.

A plurality of first nozzles 290 that spray the cleaning gas may be installed along the edge region of the substrate W. As illustrated in FIG. 4, the first nozzle 290 may be installed on an upper part of the first bath 100. A nozzle that sprays the cleaning gas may also be installed on an upper part of the second bath 200.

The installation position of the first nozzle 290 may be spaced apart from the installation position of the first bath 100. For example, although this is not illustrated separately, the first bath 100 and the second bath 200 may be disposed in the 6 o'clock and 12 o'clock positions of the base 15 (see FIG. 1), and the two nozzles may be disposed in the 3 o'clock and 9 o'clock positions of the base 15.

Figure 5:
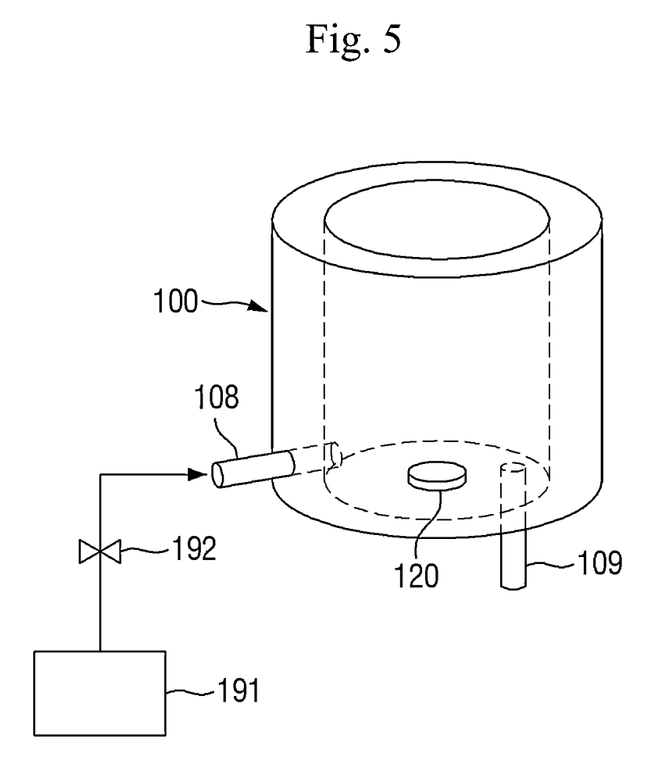
FIG. 5 is a conceptual view describing the substrate processing apparatus according to a third embodiment of the present disclosure.
Figure 6:
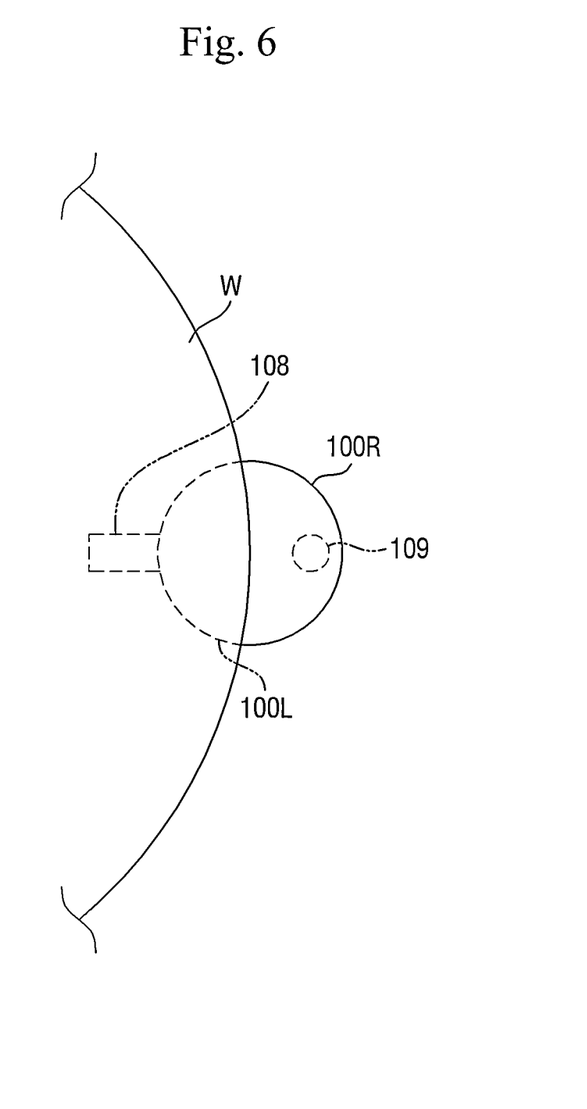
FIG. 6 is a view describing a position of an inlet/outlet of a first bath and a relationship between the first bath and the substrate illustrated in FIG. 5.

FIG. 5 is a conceptual view describing the substrate processing apparatus according to a third embodiment of the present disclosure. FIG. 6 is a view describing a position of an inlet/outlet of a first bath and a relationship between the first bath and the substrate illustrated in FIG. 5.

First, referring to FIG. 5, the first bath 110 includes a supply port 108 through which the cleaning liquid is supplied and an outlet 109 through which the cleaning liquid is discharged.

The supply port 108 is connected to a cleaning liquid supply unit. Although this is not illustrated in detail, the cleaning liquid supply unit may include a storage tank 191 configured to store the cleaning liquid, a pump configured to supply the cleaning liquid from the storage tank 191, and/or a valve 192 configured to adjust the supply amount of the cleaning liquid.

The outlet 109 may be connected to the storage tank configured to store the discharged cleaning liquid and/or a recycler configured to recycle the discharged cleaning liquid.

During the rotation of the substrate W (i.e., during the cleaning of the substrate W), the cleaning liquid is continuously supplied through the supply port 108. In this way, even if the contaminants separated from the substrate W by the protruding first water film 131 (see FIG. 3) drop on the surface of the cleaning solution 130 (see FIG. 3), the foreign substances will not adhere to one surface of the substrate W again and may be discharged via the outlet 109.

Meanwhile, the supply port 108 may be installed on a sidewall of the first bath 100, and the outlet 109 may be installed on a bottom surface of the first bath 100.

Herein, referring to FIG. 6, the first bath 100 includes a first region 100L overlapping the substrate W and a second region 100R not overlapping the substrate W. Herein, the supply port 108 may be disposed on a sidewall of the first region 100L, and the outlet 109 may be disposed on a bottom surface of the second region 100R. Accordingly, the flow of the cleaning liquid in the first bath 100 is formed from a region overlapping the substrate W to a region not overlapping the substrate W (i.e., from the first region 100L to the second region 100R). On the other hand, since the substrate W rotates during the cleaning, the protruding first water film 131 (i.e., the cleaning liquid) collides with the substrate W and splashes in the outward direction of the substrate W. In other words, the flow of the cleaning liquid in the first bath 100 may be supplemented without interfering with the movement of the cleaning liquid splashing in the outward direction. Accordingly, the contaminants may not stay in the first bath 100 and may be discharged.

Figure 7:
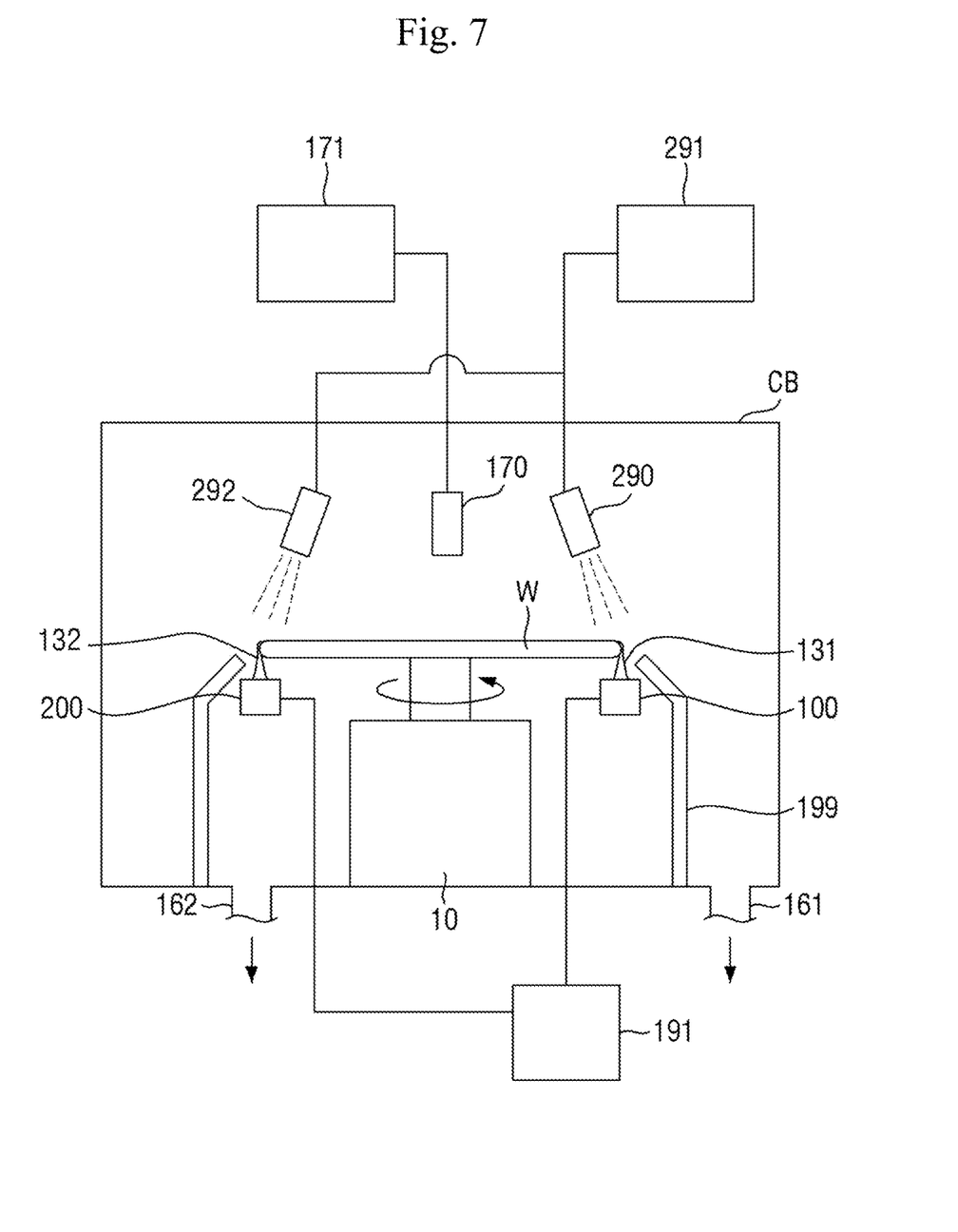
FIG. 7 is a conceptual view describing the substrate processing apparatus according to a fourth embodiment of the present disclosure.

FIG. 7 is a conceptual view describing the substrate processing apparatus according to a fourth embodiment of the present disclosure, which is an example of implementing the substrate processing apparatus using FIGS. 1 to 6 in more detail.

Referring to FIG. 7, the substrate processing apparatus according to the fourth embodiment of the present disclosure includes the support 10, the first bath 100, the second bath 200, a bowl 199 (or a cleaning cup), the first nozzle 290, and a second nozzle 292.

The support 10 configured to rotate the substrate W is disposed in a chamber CB.

The first bath 100 is installed around the support 10, stores a first cleaning liquid and forms the first opening on an upper surface thereof. The first ultrasonic oscillator is disposed on the bottom surface of the first bath 100. The first ultrasonic oscillator provides the ultrasonic wave towards a surface of the first cleaning liquid exposed by the first opening of the first bath 100, thus forming the first water film 131 protruding from the surface of the first cleaning liquid.

The second bath 200 is installed around the support 10 and is spaced apart from the first bath 100. The second bath 200 stores a second cleaning liquid and forms the second opening on an upper surface thereof. The second ultrasonic oscillator is disposed on the bottom surface of the second bath 200. The second ultrasonic oscillator provides the ultrasonic wave towards a surface of the second cleaning liquid exposed by the second opening of the second bath 200, thus forming the second water film 132 protruding from the surface of the second cleaning liquid.

The first bath 100 and the second bath 200 may be disposed in a position symmetrical around the rotational axis of the support 10. The cleaning liquid stored in the first bath 100 and the cleaning liquid stored in the second bath 200 may be different materials. Furthermore, the oscillation output of the first ultrasonic oscillator for forming the first water film 131 may be different from the oscillation output of the second ultrasonic oscillator for forming the second water film 132.

The first nozzle 290 is inclined towards the edge region of the substrate W on an upper part of the first bath 100, and sprays the cleaning gas to the upper surface of the edge region of the substrate W.

The second nozzle 292 is inclined towards the edge region of the substrate W on an upper part of the second bath 200, and sprays the cleaning gas to the upper surface of the edge region of the substrate W.

The first nozzle 290 and the second nozzle 292 are connected to a cleaning gas storage unit 291.

A third nozzle 170 configure to coat a photoresist liquid on the substrate W is disposed on the upper surface of the substrate W. The third nozzle 170 is connected to a photoresist liquid supply unit 171.

The bowl 199 is formed to surround the support 10.

Drain holes 161 and 162 may be disposed on a bottom surface of the chamber CB. The drain hole 161 is disposed outside the bowl 199, and the drain hole 162 is disposed inside the bowl 199.

During the cleaning, the cleaning liquid is continuously supplied through the supply port 108 (see FIG. 5) of the first bath 100 and the second bath 200, and discharged via the outlet 109 (see FIG. 5). The discharged cleaning liquid may be drained via the drain hole 162.

During the cleaning, the substrate (W) rotates, and the protruding first and second water films 131 and 132 (i.e., the cleaning liquid) collide with the substrate W and splash in the outward direction of the substrate W. The cleaning liquid splashing in the outward direction of the substrate W may flow along an outer surface of the bowl 199 and may be drained into the drain hole 161.

Figure 8:
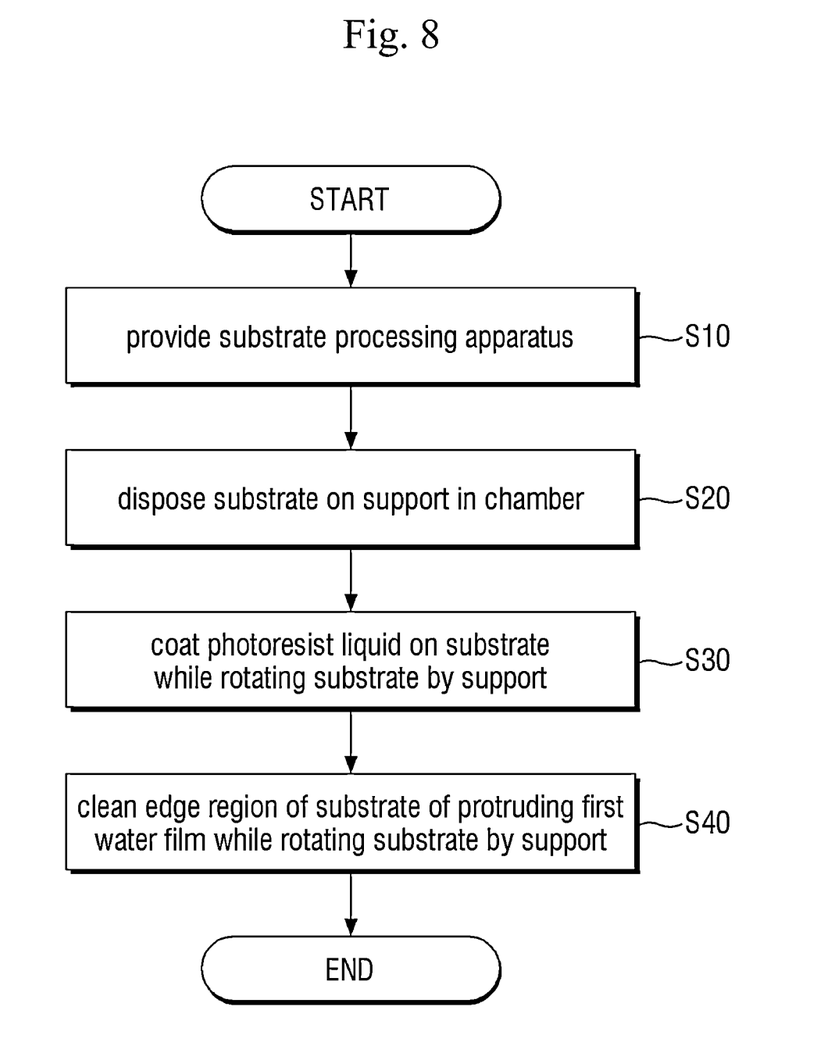
FIG. 8 is a flowchart describing a substrate processing method according to some embodiments of the present disclosure.

FIG. 8 is a flowchart describing a substrate processing method according to some embodiments of the present disclosure.

Referring to FIGS. 7 and 8, The substrate processing apparatus is provided (S10).

Then, the substrate W is disposed on the support 10 in the chamber CB (S20).

Then, during the rotating of the substrate W by the support 10, the photoresist liquid is coated on the substrate W (S30).

Then, the first and second ultrasonic oscillators provide the ultrasonic waves towards the surface of the cleaning liquid to form the first and second water films 131 and 132 protruding from the surface of the cleaning liquid, thus cleaning the edge region of the substrate W by the protruding first and second water films 131 and 132 (S40).

Herein, while cleaning the edge region of the substrate W by the protruding first and second water films 131 and 132, the first and second nozzles 290 and 292 spray the cleaning gas to the upper surface of the edge region of the substrate W.

Figure 9:
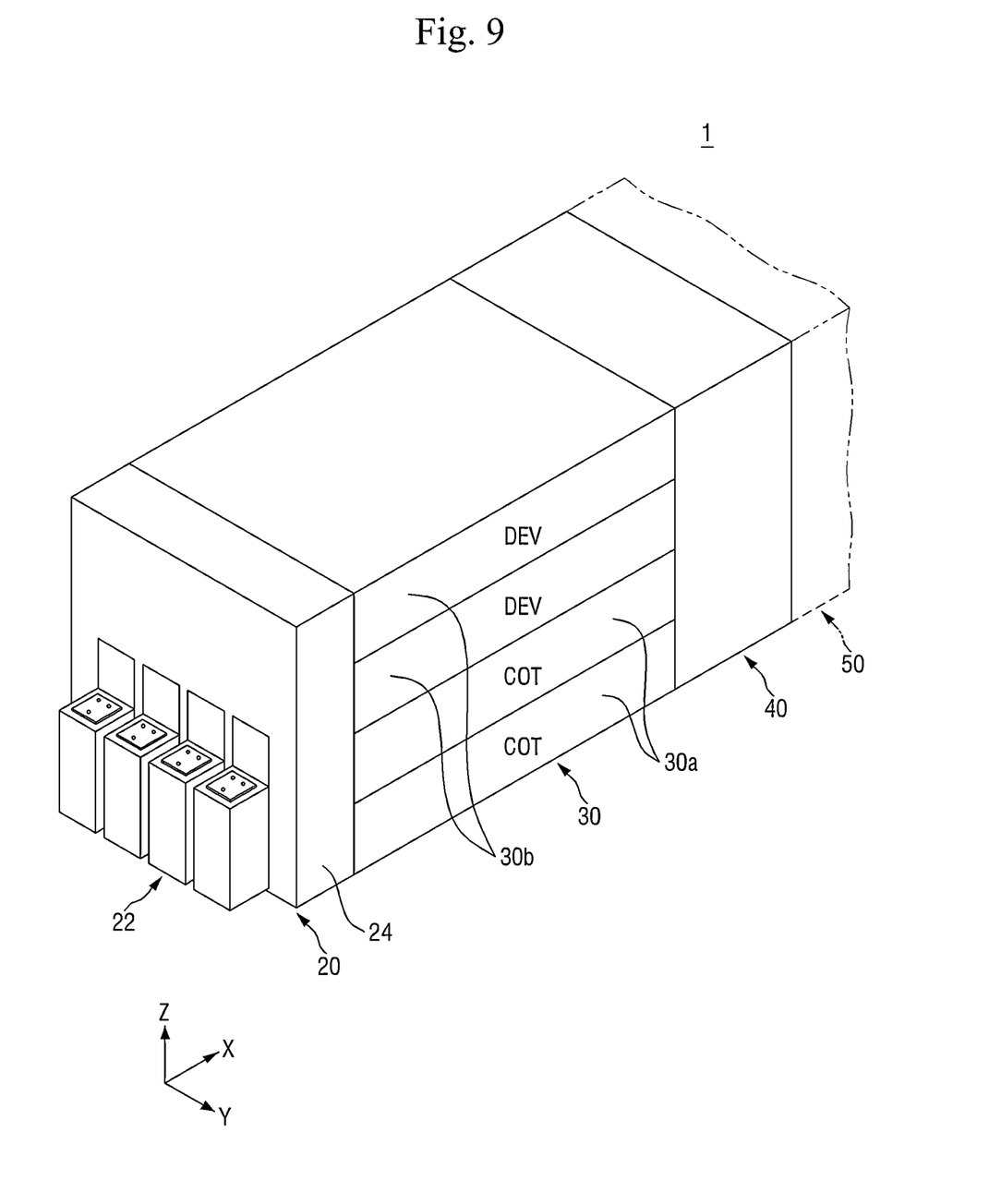
FIGS. 9 to 11 are conceptual views illustrating the substrate processing apparatus according to a fifth embodiment of the present disclosure.
Figure 10:
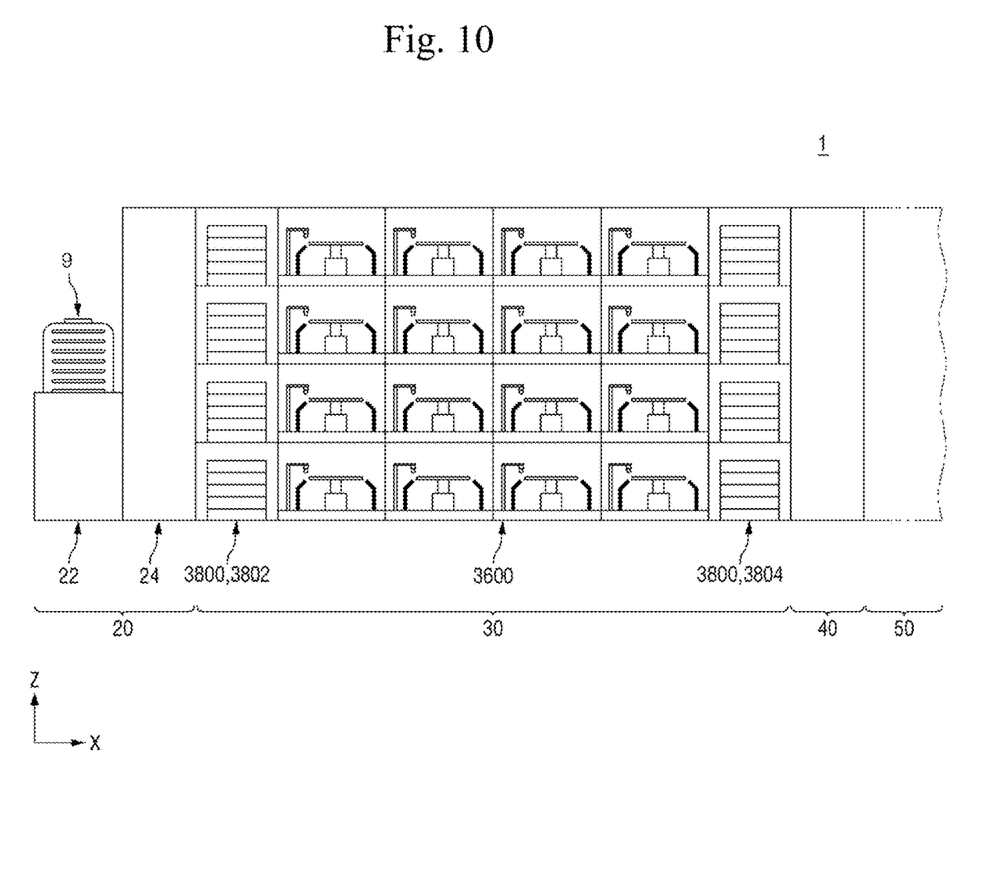
Figure 11:
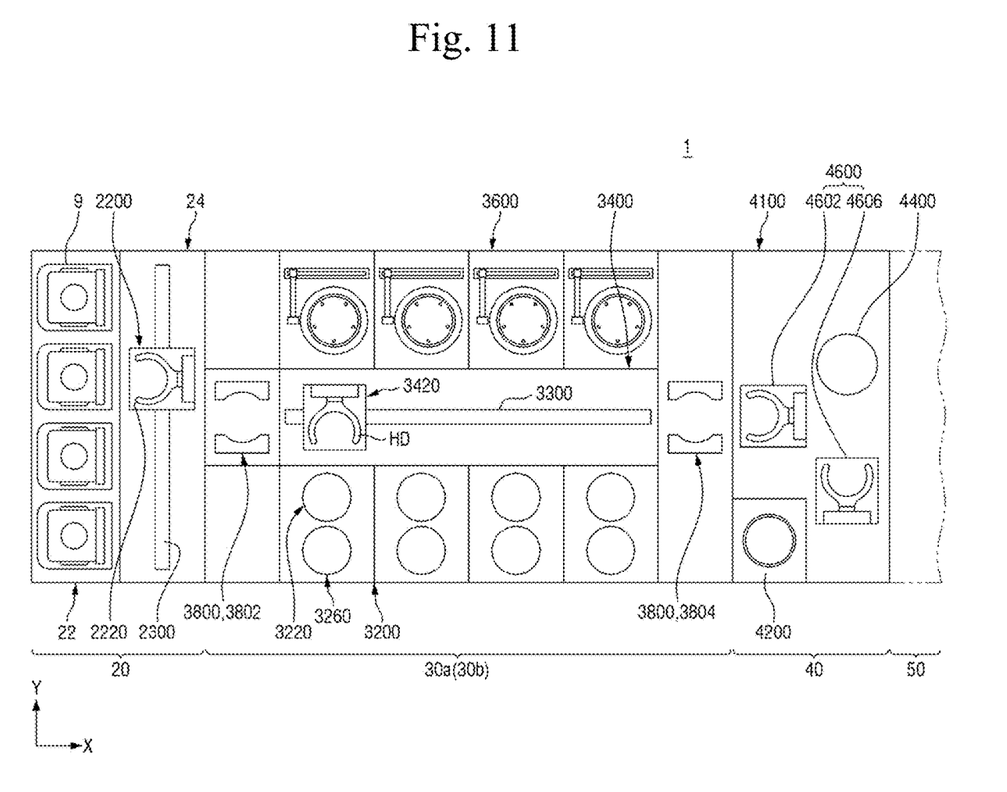

FIGS. 9 to 11 are conceptual views illustrating the substrate processing apparatus according to a fifth embodiment of the present disclosure.

Referring to FIGS. 9 to 11, the substrate processing device 1 includes an index module 20, a processing module 30, and an interface module 40. For instance, the index module 20, the processing module 30, and the interface module 40 are sequentially arranged in a row. Hereinafter, a direction in which the index module 20, the processing module 30 and the interface module 40 are arranged is referred to as an X-axis direction X, a direction perpendicular to the X-axis direction X when viewed from above is referred to as a Y-axis direction Y, and a direction perpendicular to both the X-axis direction X and the Y-axis direction Y is referred to as a Z-axis direction Z.

The index module 20 transfers the substrate W to the processing module 30 from a container 9 in which the substrate W is accommodated, and accommodates the processed substrate W in the container 9. A longitudinal direction of the index module 20 is provided in the Y-axis direction Y. The index module 20 has a load port 22 and an index frame 24. The load port 22 is disposed on the opposite side of the processing module 30 based on the index frame 24. The container 9 in which the substrates W are accommodated is placed in the load port 22. A plurality of load ports 22 may be provided, and the plurality of load ports 22 may be disposed along the Y-axis direction Y.

A sealing container 9 such as a front open unified pod (FOUP) may be used as the container 9. The container 9 may be placed on the load port 22 by a conveying means (not shown), such as an overhead transfer, an overhead conveyor, or an automatic guided vehicle (AGV), or an operator.

An index robot 2200 is provided within the index frame 24. A guide rail 2300 provided in the Y-axis direction Y as a longitudinal direction may be provided within the index frame 24, and the index robot 2200 may be movably provided on the guide rail 2300. The index robot 2200 includes a hand 2220 on which the substrate W is placed, and the hand 2220 can be provided to move forward and backward, rotate around the Z-axis direction Z, and move along the Z-axis direction Z.

The processing module 30 performs a coating process and a developing process on the substrate W. The processing module 30 has a coating block 30a and a developing block 30b. The coating block 30a performs a coating process on the substrate W, and the developing block 30b performs the developing process on the substrate W. A plurality of coating blocks 30a are provided, and these coating blocks are stacked on each other. A plurality of developing blocks 30b are provided, and these developing blocks are stacked on each other. For example, two coating blocks 30a are provided, and two developing blocks 30b are provided. As illustrated in FIG. 9, the coating blocks 30a may be disposed below the developing block 30b. According to one embodiment, the two coating blocks 30a may perform the same process and be provided in the same structure. Furthermore, the two developing blocks 30b may perform the same process and be provided in the same structure.

Herein, referring to FIG. 11, the coating block 30a has a heat treatment chamber 3200, a transfer chamber 3400, a liquid treatment chamber 3600, and a buffer chamber 3800. The heat treatment chamber 3200 performs a heat treatment process on the substrate W. The heat treatment process may include a cooling process and a heating process. The liquid treatment chamber 3600 supplies a liquid to the substrate W to form a liquid film. The liquid film may be a photoresist film or an antireflection film. The transfer chamber 3400 transfers the substrate W between the heat treatment chamber 3200 and the liquid treatment chamber 3600 in the coating block 30a.

The longitudinal direction of the transfer chamber 3400 is provided parallel to the X-axis direction X. A transfer unit 3420 is provided in the transfer chamber 3400. The transfer unit 3420 transfers the substrate between the heat treatment chamber 3200, the liquid treatment chamber 3600, and the buffer chamber 3800. According to one embodiment, the transfer unit 3420 has a hand HD on which the substrate W is placed, and the hand HD may be provided to move forward and backward, rotate around the Z-axis direction Z, and move along the Z-axis direction Z. A guide rail 3300 whose longitudinal direction is provided parallel to the X-axis direction X may be provided in the transfer chamber 3400, and the transfer unit 3420 may be movably provided on the guide rail 3300.

A plurality of buffer chambers 3800 are provided. Some of the buffer chambers 3800 are disposed between the index module 20 and the transfer chamber 3400. Hereinafter, these buffer chambers are referred to as front buffers 3802. A plurality of front buffers 3802 are provided, and these buffers are stacked on each other in the vertical direction. Others of buffer chambers 3802 and 3804 are disposed between the transfer chamber 3400 and the interface module 40. These buffer chambers are referred to as rear buffers 3804. A plurality of rear buffers 3804 are provided, and these rear buffers are stacked on each other in the vertical direction. Each of the front buffers 3802 and the rear buffers 3804 temporarily stores a plurality of substrates W. The substrate W stored in the front buffer 3802 may be carried in or out by the index robot 2200 and the transfer robot 3420. The substrate W stored in the rear buffer 3804 may be carried in or out by the transfer robot 3420 and a first robot 4602.

The developing block 30b has the heat treatment chamber 3200, the transfer chamber 3400, and the liquid treatment chamber 3600. The heat treatment chamber 3200, the transfer chamber 3400, and the liquid treatment chamber 3600 of the developing block 30b are provided in a structure and arrangement generally similar to the heat treatment chamber 3200, the transfer chamber 3400 and the liquid treatment chamber 3600 of the coating block 30a; therefore, a description thereof will be omitted.

The interface module 40 connects the processing module 30 to the external exposure device 50. The interface module 40 has an interface frame 4100, an additional process chamber 4200, an interface buffer 4400, and a transfer member 4600.

A fan filter unit configured to form a downward air flow inside may be provided in an upper end of the interface frame 4100. The additional process chamber 4200, the interface buffer 4400, and the transfer member 4600 are disposed inside the interface frame 4100. The additional process chamber 4200 may perform a predetermined additional process before the substrate W whose process has been completed in the coating block 30a is carried in the exposure device 50. Alternatively, the additional process chamber 4200 may perform the predetermined additional process before the substrate W whose process has completed in the exposure device 50 is carried in the developing block 30b. According to one embodiment, the additional process may be an edge exposure process of exposing the edge region of the substrate W, an upper surface cleaning process of cleaning the upper surface of the substrate W, or a lower surface cleaning process of cleaning the lower surface of the substrate W. A plurality of additional process chambers 4200 may be provided and stacked on each other. All of the additional process chambers 4200 may be provided to perform the same process. Alternatively, some of the additional process chambers 4200 may be provided to perform different processes.

The interface buffer 4400 provides a space where the substrate W transferred between the coating block 30a, the additional process chamber 4200, the exposure device 50 and the developing block 30b temporarily stays during the transfer. A plurality of interface buffers 4400 may be provided and the plurality of interface buffers 4400 may be stacked on each other.

According to one embodiment, the additional process chamber 4200 may be disposed on one side of the transfer chamber 3400 and the interface buffer 4400 may be disposed on the other side of the transfer chamber 3400 based on an extension line in the longitudinal direction.

The transfer member 4600 transfers the substrate W between the coating block 30a, the additional process chamber 4200, the exposure device 50, and the developing block 30b. The transfer member 4600 may be provided as one or a plurality of robots. According to one embodiment, the transfer member 4600 has a first robot 4602 and a second robot 4606. The first robot 4602 may transport the substrate W between the coating block 30a, the additional process chamber 4200 and the interface buffer 4400, the interface robot 4606 may transport the substrate W between the interface buffer 4400 and the exposure device 50, and the second robot 4604 may transport the substrate W between the interface buffer 4400 and the developing block 30b.

The first robot 4602 and the second robot 4606 each include a hand on which the substrate W is placed, and the hand may be provided to move forward and backward, rotate based on an axis parallel to the Z-axis direction 16, and move along the Z-axis direction 16.

Meanwhile, as illustrated in FIGS. 1 to 7, the liquid treatment chamber 3600 may be equipped with the first bath configured to form the protruding first water film and the second bath configured to form the protruding second water film.

An operation of cleaning the substrate using the protruding first and second water films may be performed in various steps.

For instance, in the liquid treatment chamber 3600, the substrate W forms the photoresist film or the antireflection film, and then the edge region of the substrate W is cleaned by the protruding first and second water films. Next, the substrate W is moved to the heat treatment chamber 3200, and the substrate W is baked. Then, the substrate W may be transmitted to the exposure device 50 via the interface module 40.

For another example, in the liquid treatment chamber 3600, the substrate W forms the photoresist film or the antireflection film. Next, the substrate W is moved to the heat treatment chamber 3200, and the substrate W is baked. Then, the substrate W may be transmitted to the exposure device 50 via the interface module 40. Then, after the substrate W moves back to the liquid treatment chamber 3600, the edge region of the substrate W can be cleaned by the protruding first and second water films.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

What is claimed is:

1. A substrate processing apparatus, comprising:
   a support configured to rotate a substrate;
   a first bath installed around the support and configured to store a cleaning liquid and form a first opening on an upper surface thereof; and
   a first ultrasonic oscillator installed in the first bath and configured to provide an ultrasonic wave towards a surface of the cleaning liquid exposed by the first opening and form a first water film protruding from the surface of the cleaning liquid,
   wherein an uppermost part of the first bath is located below the substrate such that the substrate is not immersed in the first bath, and the edge region of the substrate is cleaned by the protruding first water film while rotating the substrate by the support.

2. The substrate processing apparatus of claim 1, further comprising:
   a second bath spaced apart from the first bath around the support and configured to store the cleaning liquid and form a second opening on an upper surface thereof; and
   a second ultrasonic oscillator installed in the second bath and configured to provide an ultrasonic wave to a surface of the cleaning liquid exposed by the second opening to form a second water film protruding from the surface of the cleaning liquid.

3. The substrate processing apparatus of claim 2, wherein the first bath and the second bath are disposed in a position symmetrical around the rotational axis of the support.

4. The substrate processing apparatus of claim 2, wherein the cleaning liquid stored in the first bath and the cleaning liquid stored in the second bath are different materials.

5. The substrate processing apparatus of claim 2, wherein an oscillation output of the first ultrasonic oscillator for forming the first water film is different from an oscillation output of the second ultrasonic oscillator for forming the second water film.

6. The substrate processing apparatus of claim 1, wherein the first bath includes a supply port through which the cleaning liquid is supplied and an outlet through which the cleaning liquid is discharged, and
   the cleaning liquid is continuously supplied through the supply port during the cleaning of the substrate.

7. The substrate processing apparatus of claim 6, wherein the supply port is installed on a sidewall of the first bath, and the outlet is installed on a bottom surface of the first bath.

8. The substrate processing apparatus of claim 7, wherein the first bath includes a first region overlapping the substrate and a second region not overlapping the substrate, and
   the supply port is disposed in the first area.

9. The substrate processing apparatus of claim 1, wherein the first ultrasonic oscillator is installed in the first bath on the bottom surface of the first bath.

10. The substrate processing apparatus of claim 1, wherein the first ultrasonic oscillator is configured to adjust a protruding height of the first water film protruded from the surface of the clearing liquid by adjusting an oscillation output of the first ultrasonic oscillator.

11. A substrate processing apparatus, comprising:
    a support configured to rotate a substrate;
    a first bath installed around the support and configured to store a first cleaning liquid and form a first opening on an upper surface thereof;
    a first ultrasonic oscillator installed on a bottom surface of the first bath and configured to provide an ultrasonic wave towards a surface of the cleaning liquid exposed by the first opening and form a first water film protruding from the surface of the first cleaning liquid;
    a first nozzle disposed on an upper part of the first bath to be inclined towards an edge region of the substrate and configured to spray a cleaning gas to an upper surface of the edge region of the substrate;
    a second bath spaced apart from the first bath around the support and configured to store a second cleaning liquid and form a second opening on an upper surface thereof;
    a second ultrasonic oscillator installed on a bottom surface of the second bath and configured to provide the ultrasonic wave towards a surface of the second cleaning liquid exposed by the second opening and form a second water film protruding from the surface of the second cleaning liquid; and
    a second nozzle disposed on an upper part of the second bath to be inclined towards the edge region of the substrate and configured spray the cleaning gas to the upper surface of the edge region of the substrate,
    wherein uppermost parts of the first and second baths are located below the substrate such that the substrate is not immersed in the first bath and the second bath, and the edge region of the substrate is cleaned by the protruding first and second water films while rotating the substrate by the support.

12. The substrate processing apparatus of claim 11, wherein the first bath and the second bath are disposed in a position symmetrical around the rotational axis of the support.

13. The substrate processing apparatus of claim 11, wherein the cleaning liquid stored in the first bath and the cleaning liquid stored in the second bath are different materials.

14. The substrate processing apparatus of claim 11, wherein an oscillation output of the first ultrasonic oscillator for forming the first water film is different from an oscillation output of the second ultrasonic oscillator for forming the second water film.

15. The substrate processing apparatus of claim 11, wherein the first bath includes a supply port through which the cleaning liquid is supplied and an outlet through which the cleaning liquid is discharged, and the cleaning liquid is continuously supplied through the supply port during the cleaning of the substrate.

16. The substrate processing apparatus of claim 15, wherein the first bath includes a first region overlapping the substrate and a second region not overlapping the substrate, and the supply port is installed on a sidewall of the first bath, and the outlet is installed on a bottom surface of the first bath.

17. The substrate processing apparatus of claim 11, wherein:

the first ultrasonic oscillator is configured to adjust a protruding height of the first water film protruded from the surface of the first clearing liquid by adjusting an oscillation output of the first ultrasonic oscillator, and the second ultrasonic oscillator is configured to adjust a protruding height of the second water film protruded from the surface of the second clearing liquid by adjusting an oscillation output of the second ultrasonic oscillator.

* * * * *